(12) United States Patent
Kastl et al.

(10) Patent No.: US 7,679,274 B2
(45) Date of Patent: Mar. 16, 2010

(54) MONOLITHIC PIEZO ACTUATOR WITH A CHANGE IN THE ELECTRODE STRUCTURE IN THE JUNCTION REGION, AND USE OF THE PIEZO ACTUATOR

(75) Inventors: Harald Johannes Kastl, Fichtelberg (DE); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 84 days.

(21) Appl. No.: 11/996,601

(22) PCT Filed: Jul. 26, 2006

(86) PCT No.: PCT/EP2006/007406
§ 371 (c)(1),
(2), (4) Date: Jan. 24, 2008

(87) PCT Pub. No.: WO2007/012485
PCT Pub. Date: Feb. 1, 2007

(65) Prior Publication Data
US 2008/0185938 A1    Aug. 7, 2008

(30) Foreign Application Priority Data
Jul. 26, 2005    (DE) .................. 10 2005 034 814

(51) Int. Cl.
*H01L 41/083*    (2006.01)
*H01L 41/047*    (2006.01)
(52) U.S. Cl. .................................................. 310/366
(58) Field of Classification Search .......... 310/328, 310/366
See application file for complete search history.

(56) References Cited

U.S. PATENT DOCUMENTS

| 5,266,862 | A  | * | 11/1993 | Ohya ........................ 310/328 |
| 6,734,607 | B2 | * | 5/2004  | Nagaya et al. .............. 310/363 |
| 6,787,975 | B2 | * | 9/2004  | Kobayashi et al. .......... 310/366 |
| 7,042,143 | B2 | * | 5/2006  | Bindig et al. ............... 310/366 |

(Continued)

FOREIGN PATENT DOCUMENTS

DE    19928178    6/1999

(Continued)

OTHER PUBLICATIONS

International Search Report; PCT/EP2006/064682; pp. 2, Nov. 7, 2006.

*Primary Examiner*—Thomas M Dougherty
(74) *Attorney, Agent, or Firm*—King & Spalding L.L.P.

(57) ABSTRACT

A piezo actuator in a monolithic multilayer design, has at least one piezoelectrically active stack element, wherein the stack element has stacked piezoceramic layers made of piezoceramic material and electrode layers arranged between the piezoceramic layers, at least one piezoelectrically inactive terminating region arranged above the stack element, and at least one junction region arranged between the stack element and the terminating region, wherein the stack element, the terminating region and the junction region are connected to one another to form a monolithic total stack. The junction region has stacked piezoceramic layers and electrode layers arranged between the piezoceramic layers, and the piezoceramic layers and the electrode layers are in a form and are arranged on one another such that in the stack direction of the junction region one piezoelectrically active area per junction piezoceramic layer is successively changed from piezoceramic layer to piezoceramic layer.

18 Claims, 3 Drawing Sheets

U.S. PATENT DOCUMENTS

| | | | |
|---|---|---|---|
| 7,061,162 B2 | 6/2006 | Sato et al. | 310/328 |
| 7,067,960 B2 * | 6/2006 | Kobayashi et al. | 310/328 |
| 7,225,514 B2 | 6/2007 | Iwase et al. | 29/25.35 |
| 2004/0178701 A1 | 9/2004 | Sato et al. | 310/328 |
| 2004/0255443 A1 | 12/2004 | Iwase et al. | 29/25.35 |
| 2006/0238073 A1 | 10/2006 | Ragossnig et al. | 310/328 |
| 2007/0084034 A1* | 4/2007 | Omura et al. | 29/25.35 |
| 2008/0203857 A1* | 8/2008 | Kastl et al. | 310/359 |

FOREIGN PATENT DOCUMENTS

| | | | |
|---|---|---|---|
| DE | 10307825 | | 2/2003 |
| DE | 102004012282 | | 3/2004 |
| DE | 102004026572 | | 6/2004 |
| DE | 102004012033 A1 | | 10/2004 |
| JP | 7030165 A | | 1/1995 |
| JP | 11-186626 | * | 7/1999 |
| JP | 2002-299706 A | * | 10/2002 |
| WO | WO/2007/012654 | * | 2/2007 |

* cited by examiner

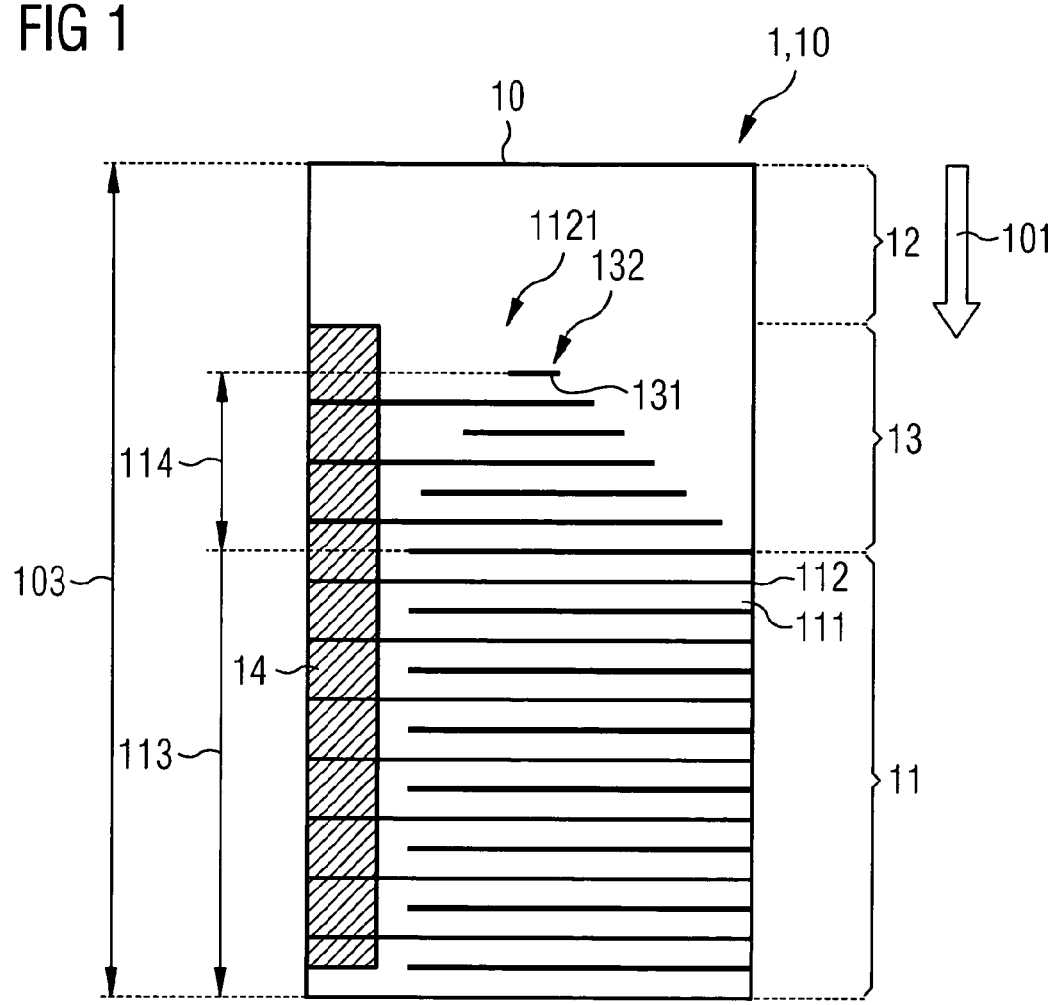

FIG 3 1321
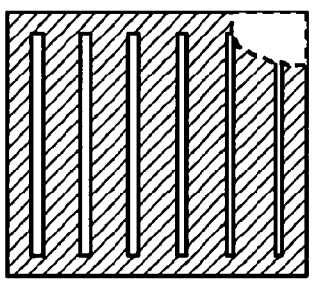
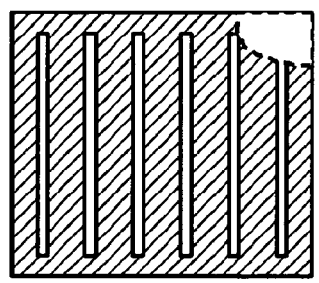
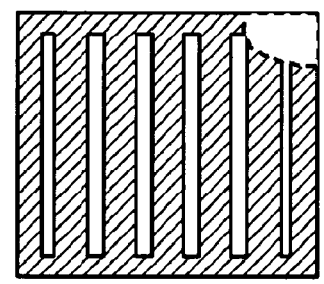
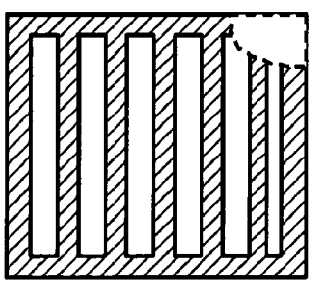
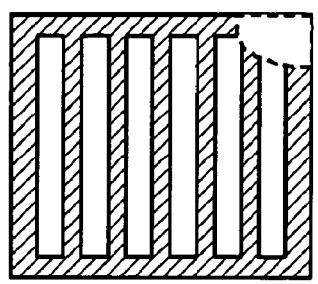
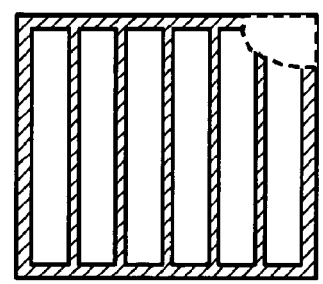

MONOLITHIC PIEZO ACTUATOR WITH A CHANGE IN THE ELECTRODE STRUCTURE IN THE JUNCTION REGION, AND USE OF THE PIEZO ACTUATOR

CROSS-REFERENCE TO RELATED APPLICATIONS

This application is a U.S. national stage application of International Application No. PCT/EP2006/007406 filed Jul. 26, 2006, which designates the United States of America, and claims priority to German application number 10 2005 034 814.9 filed Jul. 26, 2005, the contents of which are herby incorporated by reference in their entirety.

TECHNICAL FIELD

The invention relates to a piezo actuator in a monolithic multilayered design, having at least one piezoelectrically active sub-stack, where the sub-stack comprises stacked piezoceramic layers made of piezoceramic material and electrode layers (internal electrodes) arranged between the piezoceramic layers, at least one piezoelectrically inactive terminating region arranged above the piezoelectrically active sub-stack, and at least one transition region arranged between the piezoelectrically active sub-stack and the terminating region, where the piezoelectrically active sub-stack, the terminating region and the transition region are joined together to form a monolithic total stack. A use of the piezo actuator is described in addition to the piezo actuator.

BACKGROUND

Poling of the piezoceramic material occurs when such piezo actuators are driven by an electrical signal into the large-signal range for the first time (field strengths of several kV/mm). An irreversible change in length is also produced, known as the remnant strain. Tensile stresses arise in the total stack as a result of the remnant strain and because of an additional strain that occurs when an electrical signal is applied to the electrode layers during operation of the piezo actuator. These tensile stresses cause cracks (poling cracks) to appear during the poling process or during operation of the piezo actuator, for instance along an interface between a piezoceramic layer and an electrode layer. Such cracks also arise in particular in the transition region between active sub-stack and terminating region, where the most damaging cracks are those that branch off or propagate in the longitudinal direction of the total stack. Such cracks inevitably result in premature failure of the piezo actuator.

SUMMARY

There exists a need for a piezo actuator in which the likelihood of the formation and growth of the cracks described above is reduced.

According to an embodiment, a piezo actuator in a monolithic multilayered design, may comprise at least one piezoelectrically active stack, wherein the stack comprises stacked piezoceramic layers and electrode layers arranged between the piezoceramic layers, at least one piezoelectrically inactive terminating region arranged above the piezoelectrically active stack, and at least one transition region arranged between the piezoelectrically active stack and the terminating region, wherein the piezoelectrically active stack, the terminating region and the transition region are joined together to form a monolithic total stack, and wherein the transition region comprises stacked transition-region piezoceramic layers and transition-region electrode layers arranged between the transition-region piezoceramic layers, and the transition-region piezoceramic layers and the transition region electrode layers are in a form and are arranged on one another such that from transition-region piezoceramic layer to transition-region piezoceramic layer in the stack direction of the transition region, one piezoelectrically active area per transition piezoceramic layer is successively changed.

According to a further embodiment, the structure parallel to the lateral dimension of the respective transition-region electrode layer may be formed like a comb. According to a further embodiment, the structure parallel to the lateral dimension of the respective transition-region electrode layer can be shaped like a ring. According to a further embodiment, adjacent transition-region electrode layers may form an interdigital structure. According to a further embodiment, the active sub-stack and/or the terminating region may have a sub-stack height selected from the range 1 mm to 10 mm inclusive, and in particular one from the range 3 mm to 5 mm inclusive. According to a further embodiment, the transition region sub-stack may have a transition-stack height selected from the range 0.2 mm to 5.0 mm inclusive, and in particular from 0.5 mm to 2.0 mm inclusive. According to a further embodiment, the total stack may have a total-stack height that is selected from the range 10 mm to 200 mm inclusive. According to a further embodiment, the piezo actuator may be used for operating a valve, and in particular an injection valve of an internal combustion engine.

BRIEF DESCRIPTION OF THE DRAWINGS

The invention is described in greater detail below with reference to a number of exemplary embodiments and the associated figures. The figures are schematic diagrams and do not constitute drawings to scale.

FIG. 1 shows a piezo actuator in a monolithic multilayered design viewed from the side.

FIG. 3 shows a successive change in the comb-like structure of the transition-region electrode layers.

DETAILED DESCRIPTION

Figure 2A:
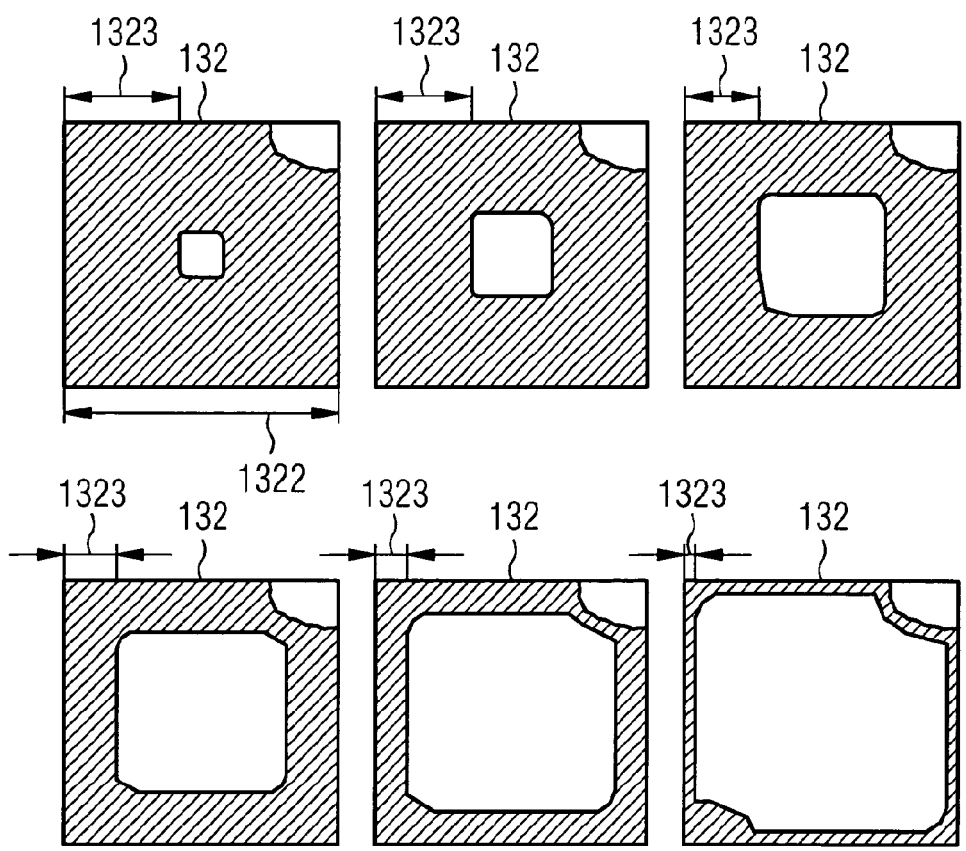
FIG. 2A shows a successive change in the structure of the transition-region electrode layers.
Figure 2B:
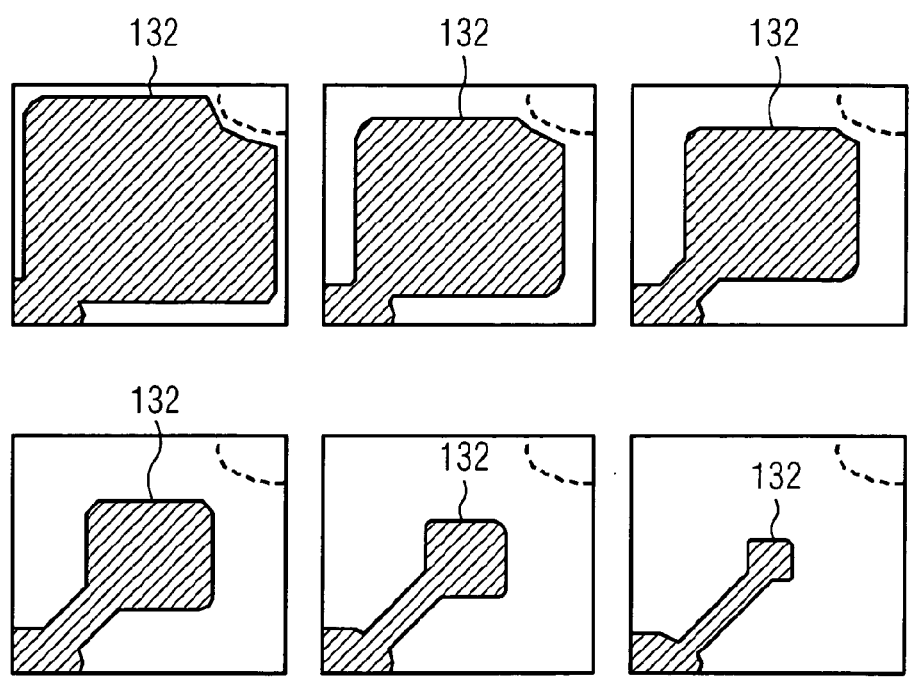
FIG. 2B shows a different change in the structure of the transition-region electrode layers.

As stated above, according to an embodiment, a piezo actuator in a monolithic multilayered design, may have at least one piezoelectrically active sub-stack, wherein the sub-stack comprises stacked piezoceramic layers and electrode layers (internal electrodes) arranged between the piezoceramic layers, at least one piezoelectrically inactive terminating region arranged above the piezoelectrically active sub-stack, and at least one transition region arranged between the piezoelectrically active sub-stack and the terminating region, wherein the piezoelectrically active sub-stack, the terminating region and the transition region are joined together to form a monolithic total stack. The transition region comprises stacked transition-region piezoceramic layers and transition-region electrode layers arranged between the transition-region piezoceramic layers, and the transition-region piezoceramic layers and the transition-region electrode layers are in a form and are arranged on one another such that from transition-region piezoceramic layer to transition-region piezoceramic layer in the stack direction of the transition region, one piezoelectrically active area per transition piezoceramic layer is successively changed. It is also quite possible to provide that the piezoelectrically active areas of two or more transition-region piezoceramic layers stacked directly above each other are identical or practically identical. These transition-region piezoceramic layers form a pack of transition-region piezoceramic layers having identical piezoelectrically active areas.

The terminating region may be a top or bottom region of the total stack. The terminating region may be composed of one layer or a plurality of layers. In the latter case, this is termed a cover pack. The terminating region can be made of ceramic materials or metals.

A piezoceramic material of the piezoceramic layers and a piezoceramic material of the transition-region piezoceramic layers can be identical. Equally, however, different materials can be used. Likewise, the layer thicknesses of these layers can be identical or different.

According to various embodiments, a transition region is provided in which the structure of the transition-region electrode layers changes progressively. As a result of the progressive change, the piezoelectrically active area, and hence the piezoelectrically active volume, varies from piezoceramic layer to piezoceramic layer. The progressive change significantly reduces the high tensile stresses known from the prior art between piezoelectrically active sub-stack and piezoelectrically inactive terminating region.

Changing the structure causes a change in the strain that occurs during the poling process or during operation. The resultant strain in the lateral direction (a/b direction) and the resultant strain in the stack direction (c direction) are no longer composed purely of the $d_{31}$ (negative) and $d_{33}$ (positive) components. The result is a superposition of these effects. For certain directions of a poling vector and drive vector with respect to the layer planes, a minimum strain is achieved in the respective directions. This results in correspondingly low mechanical tensile stresses between two layers of the transition region.

The structure of the transition-region electrode layer with respect to the lateral dimension of the respective transition-region electrode layer is formed like a comb. In a further embodiment, the structure parallel to the lateral dimension of the respective transition-region electrode layer is shaped like a ring. The comb-like structure is particularly suitable for creating an interdigital structure. Hence, according to a particular embodiment, adjacent transition-region electrode layers form an interdigital structure.

According to a particular embodiment, the active sub-stack and/or the terminating region has a sub-stack height selected from the range 1 mm to 10 mm inclusive, and in particular from the range 3 mm to 5 mm inclusive. It has been found that stress peaks are reduced very effectively using these sub-stack heights. According to a particular embodiment, the transition region sub-stack has a transition-stack height selected from the range 0.2 mm to 5.0 mm inclusive, and in particular from 0.5 mm to 2.0 mm inclusive. Very high total stacks can be achieved using the sub-stacks. In a particular embodiment, the total stack has a total-stack height that is selected from the range 10 mm to 200 mm inclusive. Higher total-stack heights are also achievable.

This new reliable piezo actuator is preferably used for operating a valve, and in particular an injection valve of an internal combustion engine. The internal combustion engine is an engine of a motor vehicle, for example.

The piezo actuator 1 is a piezo actuator having a total stack 10 in a monolithic multilayered design. The piezo actuator 1 has a piezoelectrically active sub-stack 11 comprising alternately stacked piezoceramic layers 111 made of lead zirconate titanate (PZT) as the piezoceramic material and electrode layers 112 made of a silver palladium alloy.

A piezoelectrically inactive terminating region 12 in the form of a ceramic cover pack made of ceramic layers is arranged above the piezoelectrically active sub-stack 11.

A transition region 13 in the form of a transition-region stack is arranged between the piezoelectrically active sub-stack 11 and the cover pack 12. The transition-region stack 13 has alternately stacked transition-region piezoceramic layers 131 and transition-region electrode layers 132. The piezoceramic material of the transition-region piezoceramic layers, and the piezoceramic material of the piezoceramic layers of the piezoelectrically active sub-stack 11 are identical. In an alternative embodiment, the piezoceramic materials are different. The electrode material of the transition-region electrode layers is the same as the material of the electrode layers of the piezoelectrically active sub-stack. Alternatively, different electrode materials are used.

The piezoelectrically active sub-stack 11, the transition-region stack 13 and the terminating region 12 together form a monolithic total stack 10. An external metallization 14 to make electrical contact with the respective electrode layers is applied to one side face of the total stack in the area of the active sub-stack 11 and in the area of the transition-region stack 13. There is an additional external metallization (not shown) to make contact with the alternating layers.

The total height 103 of the total stack 10 in the stack direction 101 equals 30 mm. The sub-stack height 113 of the piezoelectrically active sub-stack 11 equals approximately 10 mm. The transition region sub-stack height 114 of the transition-region stack 13 equals approximately 2 mm.

The transition-region piezoceramic layers 131 and a transition-region electrode layers 132 are in a form and arranged on one another such that from transition-region piezoceramic layer to transition-region piezoceramic layer in the stack direction 133 of the transition-region stack 13, one piezoelectrically active area per transition piezoceramic layer is successively changed. This is achieved by changing the lateral dimension 1323 of the transition-region electrode layers. The dimension 1323 changes along the lateral dimension 1322 of the transition-region electrode layers.

According to a first embodiment, the transition-region electrode layers 132 have a comb-like structure. This comb-like structure 1321 is shown in FIG. 3. According to this exemplary embodiment, the comb-like structure 1321 of the transition-region electrode layers 132 are changed successively. As shown in FIG. 2A, a gap between webs of the comb-like structure 1321 is varied from transition-region electrode layer to transition-region electrode layer. Each of the adjacent transition-region electrode layers 132 together form an interdigital structure 1121.

Further exemplary embodiments follow from the situation in which additionally, or alternatively, to the illustrated arrangement of the terminating region 12 and the transition region 13 in the top region of the total stack 10, the terminating region 12 and the transition region are arranged in the bottom region of the total stack 10.

This new piezo actuator 1 is used to operate an injection valve in an engine of a motor vehicle.

The invention claimed is:

1. A piezo actuator in a monolithic multilayered design, comprising:
    at least one piezoelectrically active stack, wherein the stack comprises stacked piezoceramic layers and electrode layers arranged between the piezoceramic layers,
    at least one piezoelectrically inactive terminating region arranged above the piezoelectrically active stack, and at least one transition region arranged between the piezoelectrically active stack and the terminating region, wherein the piezoelectrically active stack, the terminating region and the transition region are joined together to form a monolithic total stack, and wherein the transition region comprises stacked transition-region piezoceramic layers and transition-region electrode layers arranged between the transition-region piezoceramic layers, and the transition-region piezoceramic layers and the transition-region electrode layers are in a form and are arranged on one another such that from transition-region piezoceramic layer to transition-region piezoceramic layer in the stack direction of the transition region, one piezoelectrically active area per transition piezoceramic layer is successively changed, wherein adjacent transition-region electrode layers form an interdigital structure.

2. The piezo actuator according to claim 1, wherein the structure parallel to the lateral dimension of the respective transition-region electrode layer is formed like a comb.

3. The piezo actuator according to claim 1, wherein the structure parallel to the lateral dimension of the respective transition-region electrode layer is shaped like a ring.

4. The piezo actuator according to claim 1, wherein the active sub-stack and/or the terminating region has a sub-stack height selected from the range 1 mm to 10 mm inclusive.

5. The piezo actuator according to claim 1, wherein the transition region sub-stack has a transition-stack height selected from the range 0.2 mm to 5.0 mm inclusive.

6. The piezo actuator according to claim 1, wherein the total stack has a total-stack height that is selected from the range 10 mm to 200 mm inclusive.

7. The piezo actuator according to claim 1, wherein the active sub-stack and/or the terminating region has a sub-stack height selected from the range 3 mm to 5 mm inclusive.

8. The piezo actuator according to claim 1, wherein the transition region sub-stack has a transition-stack height selected from the range 0.5 mm to 2.0 mm inclusive.

9. A method for providing a piezo actuator, comprising the steps of:

providing at last one piezoelectrically active stack, wherein the stack comprises stacked piezoceramic layers and electrode layers arranged between the piezoceramic layers, arranging at least one piezoelectrically inactive terminating region above the piezoelectrically active stack, and arranging at least one transition region between the piezoelectrically active stack and the terminating region, joining the piezoelectrically active stack, the terminating region and the transition region together to form a monolithic total stack, wherein the transition region comprises stacked transition-region piezoceramic layers and transition-region electrode layers arranged between the transition-region piezoceramic layers, and the transition-region piezoceramic layers and the transition-region electrode layers are in a form and are arranged on one another such that from transition-region piezoceramic layer to transition-region piezoceramic layer in the stack direction of the transition region, one piezoelectrically active area per transition piezoceramic layer is successively changed, wherein adjacent transition-region electrode layers form an interdigital structure.

10. The method according to claim 9, further comprising the step of forming the structure parallel to the lateral dimension of the respective transition-region electrode layer like a comb.

11. The method according to claim 9, further comprising the step of shaping the structure parallel to the lateral dimension of the respective transition-region electrode layer like a ring.

12. The method according to claim 9, wherein the active sub-stack and/or the terminating region has a sub-stack height selected from the range 1 mm to 10 mm inclusive.

13. The method according to claim 9, wherein the active sub-stack and/or the terminating region has a sub-stack height selected from the range 3 mm to 5 mm inclusive.

14. The method according to claim 9, wherein the transition region sub-stack has a transition-stack height selected from the range 0.2 mm to 5.0 mm inclusive.

15. The method according to claim 9, wherein the transition region sub-stack has a transition-stack height selected from the range 0.5 mm to 2.0 mm inclusive.

16. The method according to claim 9, wherein the total stack has a total-stack height that is selected from the range 10 mm to 200 mm inclusive.

17. The method according to claim 9, further comprising the step of operating a valve with said piezo actuator.

18. The method according to claim 16, wherein the valve is an injection valve of an internal combustion engine.

* * * * *